United States Patent [19]
Burch et al.

[11] Patent Number: 5,793,824
[45] Date of Patent: Aug. 11, 1998

[54] DIGITAL PHASE LOCKED LOOP HAVING ADAPTIVE BANDWIDTH FOR PULSE STUFFING SYNCHRONIZED DIGITAL COMMUNICATION SYSTEM

[75] Inventors: Richard A. Burch; Michael D. Turner, both of Madison, Ala.

[73] Assignee: Adtran, Inc., Huntsville, Ala.

[21] Appl. No.: 641,226

[22] Filed: Apr. 30, 1996

[51] Int. Cl.$^6$ ............................................. H04J 3/07
[52] U.S. Cl. .................... 375/372; 375/376; 370/506; 370/516; 364/724.011
[58] Field of Search ...................... 375/354, 371–373, 375/376; 370/503, 505, 506, 516, 517; 364/724.01; 327/141, 155, 156, 159; 331/17, 25, 32, 1 A

[56] References Cited

U.S. PATENT DOCUMENTS

| | | | |
|---|---|---|---|
| 5,200,982 | 4/1993 | Weeber | 375/372 |
| 5,390,180 | 2/1995 | Reilly | 370/516 |
| 5,402,452 | 3/1995 | Powell et al. | 375/372 |

*Primary Examiner*—Don N. Vo
*Assistant Examiner*—Amanda T. Le
*Attorney, Agent, or Firm*—Charles E. Wands

[57] ABSTRACT

A bandwidth-adaptive digital phase locked loop-based clock control arrangement controls the generation of a read-out clock used for retiming digital data signal interfaced with a synchronous data channel of a communication system, in which pulse-stuffing synchronization is employed to maintain clock synchronization of the digital data signal that is not bit-synchronous with a synchronous digital data channel over which the digital data signal is transported. The bandwidth-adaptive digital phase locked loop includes a loop filter to which the error signal is applied and a phase accumulator, coupled to the output of the loop filter and being operative to stepwise adjust the read-out clock signal. The loop filter has a first scaled path that includes a first, controllably stepped gain stage, and a second scaled path that includes a second, controllably stepped gain stage coupled to a frequency accumulator. The output of the frequency accumulator and the first stepped gain stage are summed and coupled to the phase accumulator. The gain of each of the first and second gain stages is incrementally adjusted in accordance with the magnitude of the error signal.

11 Claims, 3 Drawing Sheets

DIGITAL PHASE LOCKED LOOP HAVING ADAPTIVE BANDWIDTH FOR PULSE STUFFING SYNCHRONIZED DIGITAL COMMUNICATION SYSTEM

FIELD OF THE INVENTION

The present invention relates in general to digital data communication systems and, more particularly, to a new and improved digital phase locked loop-based clock control arrangement that may be employed in an apparatus for reducing the maximum time interval error (MTIE) generated by a pulse stuffing synchronization mechanism.

BACKGROUND OF THE INVENTION

One technique for transporting a DS1 signal over twisted-pair wires is known as high-bit-rate digital subscriber line (HDSL). HDSL uses pulse-stuffing synchronization to transport the DS1 signal asynchronously to the signal transport mechanism (the synchronized signal), which is timed via the HDSL master oscillator. Pulse stuffing synchronization involves the selective insertion of pulses into a digital data frame being transported over a synchronous digital data channel, in order to maintain clock synchronization where the synchronous digital data channel employs a clock that is not bit-synchronous with the digital data signal to be transported.

The basic technique for reducing timing delay variations (resulting in MTIE) is to use a digital phase locked loop-based clock control arrangement, such as that diagrammatically illustrated in FIG. 1, to filter a timing reference, such as, but not limited to, that derived at the HDSL receiver for delivering the T1 data bits. For example, as data is recovered by a receiver demodulator (not shown), or alternatively interfaced with a transmitter, it is serially coupled over a data input link 11 to an elastic data buffer 13. The digital data signal data is clocked into the buffer by means of a clock signal associated with data symbol timing, such as that of recovered data from a receiver, supplied over a clock line 15. However, due to the presence or absence of stuff quats, this clock signal may contain large adjustments (two quats or approximately 5000 ns) at multiples of nominally six milliseconds (or a frequency of 167 Hz). Because the insertion of stuff quats is dependent upon frequency offset at the transmitter and therefore cannot be anticipated, it is not possible to smooth out such +/−2500 ns adjustments ahead of time in a predictable manner.

Data is read out of the buffer's output port 17 to the customer by means of a separately generated DS1 clock which is applied to the buffer 13 by way of read clock line 18. (In order that data will always be available from the buffer output port 17, a fixed offset that is not part of the error signal on line is built in between the data-in and data-out pointers to the buffer.) This DS1 read clock is controlled with respect to the timing delay variations, since it cannot be allowed to simply track the input clock and occasionally contain 5000 ns 'gaps'.

The (time) difference between these two clocks (corresponding to the bit position difference in data-in and data-out pointers for the buffer 13) is used as an error signal, which is coupled over line 19 to a conventional second order phase locked loop 20, which controls the generation of the DS1 read-out clock. As diagrammatically shown by sampling switch 16, the error signal is sampled once per frame, which is nominally at the above rate of 167 Hz.

The phase locked loop 20 contains a loop filter 21, having a direct scaled path 22 through a gain stage 23 to a first input 41 of a summing stage 40, and a scaled path 24 through a gain stage 25 to a frequency accumulator 26, the output of which is coupled to a second input 42 of summing stage 40. Frequency accumulator 26 includes a summing unit 30 having a first input 31 coupled to the output of gain stage 25, and a second input 32 coupled by way of a single bit delay stage 34 from the output of summing unit 30. The output 33 of summing unit 30 is coupled to the second input 42 of summing stage 40. The output 43 of summing stage 40 constitutes a frequency term $F_M$, which is representative of the frequency error between the data-in and data-out clocks (pointer error) to the buffer 13, once the loop has stabilized. The loop filter 21 is updated once per frame and the frequency output $F_M$ is coupled over line 46 to a phase (value) accumulator 50.

Phase accumulator 50 operates at a prescribed miniframe rate (e.g., 64 times baud), as shown by sampling switch 48, so that it re-samples each frequency word 64 times. The phase accumulator 50 is required to run at a higher rate (even though its input 51 does not change for 64 samples), so that the phase can be adjusted a large number of times in small steps within each frame as needed, rather than taking larger steps less often, violating MTIE requirements.

Phase accumulator 50 comprises a gain stage 53 to a first input 61 of an adder 60, which has an output 63 coupled to the input 71 of a phase adjustment stage 70 and to the data input 65 of a one-bit delay (flip-flop) stage 67. The output 68 of one-bit delay stage 67 is coupled to a second input 62 of adder 60. One-bit delay stage 67 has a clock input 66 coupled to the output 72 of phase adjustment stage 70. The output 72 of phase adjustment stage 70 is further coupled to a control input 81 of a DS1 clock divider 80. DS1 clock divider 80 has a clock input 82 coupled to the output of a nominal clock generator 90. DS1 clock divider 80 has its clock output 83 coupled to the read clock port line of data buffer 13.

The phase value accumulator 50 is operative to store fractional values of a ministuff; it rolls over to produce a DS1 read clock update, once its has accumulated a full ministuff. However, the "fractional" segment also contains some overhead beyond one ministuff at full scale. This allows for a small amount of hysteresis in the phase accumulator, so that it is not necessary to alternate between inserting and deleting a ministuff when frequency offset is very low. This overhead also makes it possible to handle unusual frequency values that might accumulate more than a ministuff per miniframe for a very short period of time without confusing the phase accumulation by dropping bits. Such a frequency over-range could only be the result of a temporary transient during pull-in or a sudden clock change.

When the digital phase word $P_m$ at the output of adder 60 reaches a value that is equal to or exceeds a positive threshold $+V_T$, a delete (slow clock) signal is coupled to DS1 clock divider 80. When the digital phase word $P_m$ at the output of adder 60 reaches a value that is equal to or less than a negative threshold $-V_T$, an insert (fast clock) signal is coupled to DS1 clock divider 80. This operation may be considered to be analogous to a "carry" operation, where the phase accumulator 50 and DS1 clock together form a "super accumulator." Reaching or exceeding a threshold is equivalent to a "carry" from the lower bits stored in the phase accumulator 50 to the upper "bits" (cycles of the 25.088 MHz clock produced by nominal clock generator 90), which hold the entire history of all the adjustments indefinitely.

The phase accumulator 50 itself is adjusted when a ministuff is "carried" from the accumulator into the clock divider. This "adjustment" is carried out by single bit stage 67, which effectively subtracts a value of one ministuff from the phase value, since it has been transferred into DS1 clock. Similarly, deletion of a clock cycle (a ministuff adjustment) will cause one ministuff to be added back into the phase accumulator.

As pointed out above, the adjusted DS1 clock at the output 82 of clock divider 80, which has been controlled by the insert and delete operations, described above, is used to control the location of the pointer which reads data out of the buffer 13. At this point, the controlling signal is reflected back into the error calculation and the loop has been closed.

The phase locked loop-based clock control arrangement of FIG. 1 employs traditional scaling constants, with the accumulators using a conventional 'boxcar" or square top integration function—integrating the input signal, multiplying the function by the time width of the sample and accumulating the result. The gain T of the gain stage 53 of the phase accumulator 50 is equal to the time associated with the sampling rate. The T' component of the gain stage 25 is 64 times larger, reflecting the sampling rate which is 64 times slower.

The other gains in the loop filter 21 are those employed by a conventional second order phase locked loop. The gain $w_o^2$ is the gain of gain stage 25 into the accumulator and the gain a of gain stage 23 is the gain for the direct path. For continuous phase locked loop signal processing, this corresponds to a two pole system with $w_0$ representing the distance form the origin to the poles and the 'a' value of the gain stage 23 being twice the damping ratio.

SUMMARY OF THE INVENTION

In accordance with the present invention, the digital phase locked loop-based clock control arrangement of FIG. 1 is improved by making the bandwidth adaptive, based on the size of the error signal, effecting a step-wise adjustment of the gains through the two gain stage paths through the loop filter. For this purpose, as in the conventional clock control arrangement of FIG. 1, described above, an elastic buffer has a data input port to which T1 data is serially clocked by means of a clock signal associated with the data symbol timing. T1 data is read out of the buffer's output port by means of an adjustable DS1 clock signal, which is stepwise adjusted by the phase locked loop. Again, the difference between the data-in and data-out clocks, defined by the bit position difference in data-in and data-out pointers for the elastic buffer, is used as an error signal. This error signal is coupled to a 'bandwidth-stepped' second order phase locked loop of the present invention, which controls the generation of the DS1 read-out clock.

The improved phase locked loop contains a loop filter having a direct scaled path through a first, controllably stepped gain stage and a scaled path through a second, controllably stepped gain stage to a frequency accumulator. In the improved digital phase locked loop-based clock control arrangement of the present invention, the delay stage for the loop filter accumulator and the delay stage for the phase accumulator are forty bits in length. These word lengths are a direct result of the range needed in the gain set—specifically, the minimum gains needed—in concert with the maximum values needed for the accumulators.

The output of the frequency accumulator is a frequency term $F_M$, representative of the frequency (buffer pointer) error between the data-in and data-out clocks to the elastic data. The loop filter is updated once per frame and the frequency output $F_M$ is coupled directly to a phase accumulator, without gain scaling at the input. Instead, the gain scaling is 'pushed 'back' into the gains of the gain stages of the loop filter. This gain-shifting provides two advantages: it eliminates the need for multiply at the phase accumulator input, and provides a very convenient scaling mechanism for the frequency accumulator in the loop filter. The phase accumulator re-samples each frequency word 64 times, so that the phase can be adjusted a large number of times in small steps within each frame as needed.

The phase accumulator includes a multi-bit (e.g., forty-bit) delay stage. The output of the phase accumulator is coupled to a phase adjustment stage, the output of which is coupled to a DS1 clock divider. The DS1 clock divider is operative to incrementally adjust the clock signal generated by a clock generator for application to the read clock port of the elastic data buffer. As in the phase accumulator of FIG. 1, when the accumulated digital phase word reaches a value that is equal to or exceeds a positive threshold, a delete (slow clock) signal is coupled to the DS1 clock divider. Conversely, when the digital phase word reaches a value that is equal to or less than a negative threshold, an insert (fast clock) signal is coupled to the DS1 clock divider.

For a phase accumulator threshold value set equal to unity, an insert signal will be generated whenever the phase accumulator value exceeds whatever bit has been chosen to represent one ministuff of phase. The absence of a scaling gain stage at the input to the phase accumulator means that whatever bit in the frequency accumulator 'lines up' with the bit representing one ministuff in the phase accumulator will necessarily represent one ministuff per miniframe.

If this bit in the frequency accumulator happens to be a one (and all other bits are zero), it will cause the phase accumulator to accumulate one ministuff per miniframe. As a consequence, the scaling implied for this bit in the frequency accumulator is one ministuff per miniframe. By determining a range of offsets in ministuffs per miniframe, and how much overshoot range is needed, the magnitude of the high end of the frequency accumulator is readily determined. As will be described, a threshold of one, which yields two ministuffs per correction, may be employed for a loop with a phase resolution of one ministuff phase resolution.

To facilitate implementing the multiplication operation implicit in the gain stages of the loop filter, the gain values are preferably binary values (readily implemented with bit shift operations). For the direct gain stage of the loop filter, a maximum value may be selected to ensure that the frequency loop can immediately respond to a large phase error. If it is assumed that the pointer error is not allowed to exceed 256 ministuffs, the maximum value of gain is chosen to be $2^{-9}$. With an error of 256, this leads to an immediate filter output through the direct path of $256*2^{-9}=0.5$ ministuffs per miniframe.

For an input of 0.5, the phase accumulator will insert a ministuff every two frames, which will more than correct for any valid frequency offset, so that it may be expected that the largest error signal will be on the order of eight bits (256 ministuffs) plus a sign bit, or nine bits. Choosing a convenient multiple of four bits (yielding a twelve bit error signal) will allow for errors up to +/−32 stuffs without overflow.

The gain value for the gain stage to the frequency accumulator is determined by selecting a damping factor, based upon the gain through the direct gain stage. For a fast response due to latency between the time that an error is introduced at the HDSL transmitter and when it is detected at the receiver, a damping factor of 0.5 may be employed. To reach lower bandwidths without changing the damping ratio, as the gain through the direct gain stage is changed, the square of that changed value is applied to the gain of the gain stage to the frequency accumulator. Bandwidth steps of factors of four minimizes the number of gains required. Analysis has been determined that in bandwidth steps of four, a minimum of seven steps are needed.

DETAILED DESCRIPTION

Figure 1:
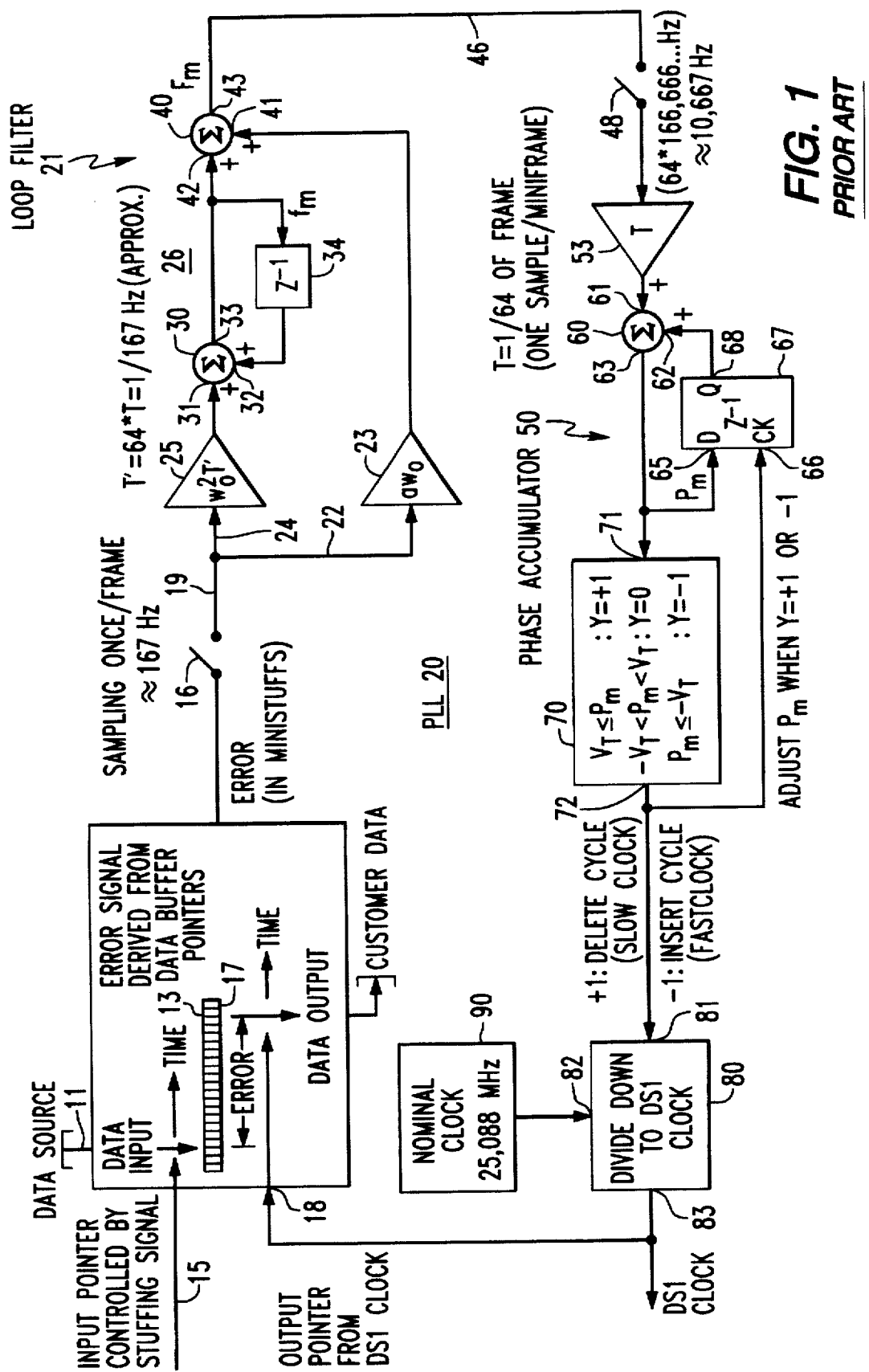
FIG. 1 diagrammatically illustrates a conventional digital phase locked loop-based arrangement to filter the time reference derived at an HDSL receiver for extracting T1 data from an elastic buffer.

Before describing in detail the new and improved digital phase locked loop-based clock control arrangement in accordance with the present invention, it should be observed that the invention resides primarily in what is effectively a prescribed arrangement of conventional communication circuits and associated digital signal processing components. Consequently, the configuration of such circuits components and the manner in which they are interfaced with other communication system equipment have, for the most part, been illustrated in the drawings by readily understandable block diagrams, which show only those specific details that are pertinent to the present invention, so as not to obscure the disclosure with details which will be readily apparent to those skilled in the art having the benefit of the description herein. Thus, the block diagram illustrations are primarily intended to show the major components of the system in a convenient functional grouping, whereby the present invention may be more readily understood.

Figure 2:
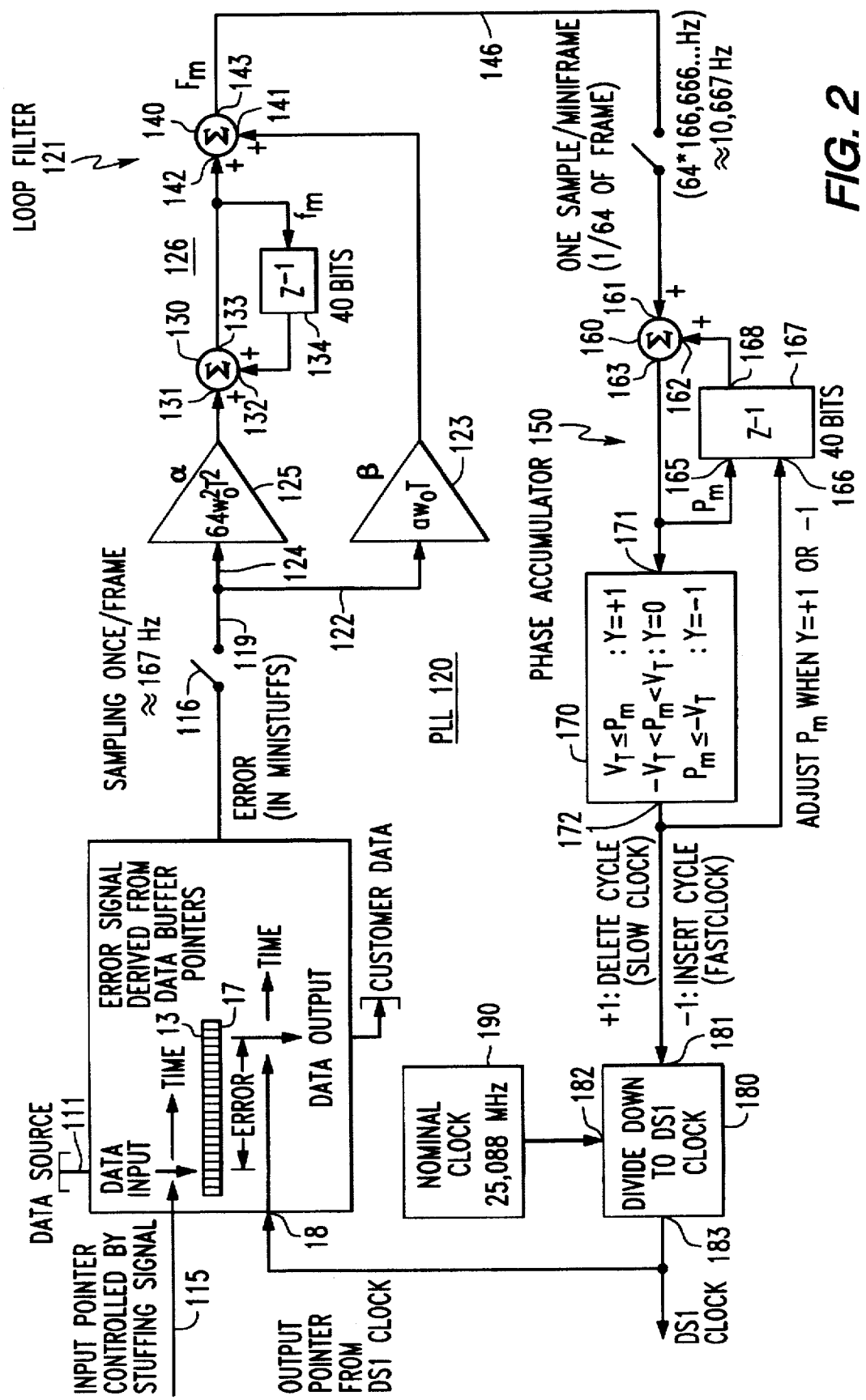
FIG. 2 diagrammatically illustrates the improved digital phase locked loop-based clock control arrangement of the present invention.

Referring now to FIG. 2, the improved digital phase locked loop-based clock control arrangement of the present invention is diagrammatically illustrated as comprising an elastic buffer 113, to a data input port 111 of which T1 data, such as that recovered by a receiver demodulator (not shown), is serially coupled. As in the conventional arrangement of FIG. 1, the digital data is clocked into the buffer by means of a clock signal derived from the recovered symbol timing, supplied over a clock line 115. T1 data is read out of the buffer's output port 117 by means of a DS1 clock signal, which is applied to the buffer by way of read clock line 118. Again, the difference between the data-in and data-out clocks, defined by the bit position difference in data-in and data-out pointers for the buffer 113, is used as an error signal, which is coupled over line 119 to the bandwidth stepped second order phase locked loop 120 of the present invention, which controls the generation of the DS1 read-out clock. The error signal on line 119 is again sampled, as shown at 116, once per frame (every six ns or nominally at the above-referenced rate of 167 Hz).

Phase locked loop 120 contains a loop filter 121, having a direct scaled phase adjustment path 122 through a first controllably stepped β gain stage 123 to a first input 141 of an adder 140, and a scaled frequency adjustment path 124 through a second controllably stepped α gain stage 125 to a frequency accumulator 126. As will be described below with reference to a GAIN CONTROL TABLE, the respective gain value β and α of each of β and α gain stages 123 and 125 is controllably defined to have a value that is dependent upon the magnitude of the error signal on line 119. In particular, the gain value of each of the respective β and α gain stages 123 and 125 has one of a plurality of respective different values, that is associated with one of a plurality of respective different ranges of error signal magnitude. To adjust the gain in accordance with error signal magnitude, each gain stage preferably employs a gate array to detect within which range of variation the error signal falls, with the output of the gate array digitally setting the gain.

The output of frequency accumulator 126 is coupled to a second input 142 of summing stage 140. Accumulator 126 includes an adder 130 having a first input 131 coupled to the output of the second controllably stepped gain α stage 125, and a second input 132 coupled by way of a multi-bit (e.g., forty-bit) delay stage 134 from the output of adder 130. The output 133 of adder 130 is coupled to the second input 142 of adder 140. The output 143 of adder 140 constitutes the frequency term $F_M$, representative of the frequency (buffer pointer) error between the data-in and data-out clocks to the buffer 113. The loop filter 121 is updated once per frame and the frequency output $F_M$ is coupled over line 146 to a phase (value) accumulator 150. As in the phase-locked loop of FIG. 1, the phase accumulator 150 operates at a prescribed miniframe rate (e.g., 64 times baud), so that it re-samples each frequency word 64 times, so that the phase can be adjusted a large number of times in small steps within each frame as needed.

Phase accumulator 150 comprises an adder 160 having a first input 161 coupled to line 146 from the loop filter 121, and an output 163 coupled to the input 171 of a phase adjustment stage 170 and to the data input 165 of a multi-bit (e.g., forty-bit) delay stage 167. The output 168 of multi-bit delay stage 167 is coupled to a second input 162 of adder 160. Multi-bit delay stage 167 has a clock input 166 coupled to the output 172 of phase adjustment stage 170. The output 172 of phase adjustment stage 170 is further coupled to a control input 181 of a DS1 clock divider 180. The DS1 clock divider 180 has a clock signal input 182 coupled to the output of a nominal clock generator 190. DS1 clock divider 180 has its clock output 183 coupled to the read clock line 118 of data buffer 113.

As in the operation of the phase accumulator 60 of FIG. 1, when the digital phase word $P_m$ at the output of adder 160 reaches a value that is equal to or exceeds a positive threshold $+V_T$, a delete (slow clock) signal is coupled to DS1 clock divider 180. Conversely, when the digital phase word $P_m$ at the output of adder 160 reaches a value that is equal to or less than a negative threshold $-V_T$, an insert (fast clock) signal is coupled to DS1 clock divider 180.

As can be seen from a comparison with FIG. 1, in the phase locked loop of FIG. 2, the gain stage 53 at the input to the phase accumulator 50 is eliminated; however, its gain T is retained by being 'pushed 'back' into the gains of respective β and α gain stages 123 and 125 of the loop filter 121. This gain-shifting provides two advantages. First, it eliminates the need for multiply at the phase accumulator input, thereby reducing hardware complexity. Second, it provides a very convenient scaling mechanism for the frequency accumulator in the loop filter.

To illustrate, let the threshold value $V_T$ for the phase accumulator 150 be equal to unity, so that an insert (fast clock) signal (−1) will be generated whenever the phase accumulator value $P_m$ exceeds whatever bit has been chosen to represent one ministuff of phase. The absence of a T-scaling gain stage in the output path 146 from the loop filter 121 into the phase accumulator 150 means that the bit in the frequency accumulator 126 which 'lines up' with the bit representing one ministuff in the phase accumulator 150 must represent one ministuff per miniframe.

If this bit in the frequency accumulator 126 happens to be a one (and all other bits are zero), it will cause the phase accumulator 150 to accumulate one ministuff every time it is updated, or once per miniframe. As a consequence, the scaling implied for this bit in the frequency accumulator is one ministuff per miniframe (or one stuff per frame). By determining a range of offsets in stuffs per frame (or ministuffs per miniframe), and how much overshoot range is needed, the magnitude of the high end of the frequency accumulator can be determined—namely, the largest frequency to be accommodated, or what the most significant bit (MSB) must be in stuffs/frame. It remains to be determined how small a fraction of a stuff per frame must be retained, i.e., which bit is the least significant bit (LSB).

The various gains and parameters needed in the phase locked loop of FIG. 2 may be determined as follows. As a non-limiting illustration, one ministuff may be selected as the threshold $V_T$ for the phase accumulator 150. With a range of (+/−1), there is a slight amount of hysteresis available to the loop. A smaller range of (+/−0.5) or less would effectively force the system to continuously perform inserts and deletes, without the opportunity to become stabilized. For a range of (+/−1), if the phase accumulator has just inserted a pulse (for small offsets), it will be reset to near zero, so it can 'coast' up or down for one ministuff, before it has to perform another ministuff. This should lead to around one ministuff of jitter for a constant offset.

If the sign of the frequency offset is reversed, the accumulator could drift for one ministuff in the opposite direction (for a total change of two ministuffs) before applying a correction to the DS1 clock divider 180. While a larger value than two ministuffs per correction could be chosen, if the frequency offset reverses sign, the drift will be greater than two ministuffs before a correction is made. As a consequence, a threshold $V_T$ of one, which yields two ministuffs per correction, is considered to be reasonably acceptable for a loop with a phase resolution of one ministuff phase resolution.

To facilitate implementing the multiplication operation implicit in the β gain stage 123 and α gain stage 125 of the loop filter 121, the gain values are preferably binary values that can be implemented with bit shift operations. For the β gain stage 123 (which has an overall direct gain of β), a maximum value may be selected to ensure that the frequency loop can immediately respond to a large phase error.

As a non-limiting example, let it be assumed that the pointer error is not allowed to exceed four stuffs (4*64=256 ministuffs). For a maximum frequency offset well below 0.5 ministuffs per miniframe, if it can be ensured that the loop can immediately insert 0.5 ministuffs per miniframe, then when the error reaches 256 ministuffs, it can be ensured that the error will never exceed (or even reach) this value. Thus, the maximum value of β is chosen to be $2^{-9}$. With an error of 256, this leads to an immediate filter output through the direct path of $256*2^{-9}=0.5$ ministuffs per miniframe.

For an input of 0.5, the phase accumulator will insert a ministuff every two frames, which will more than correct for any valid frequency offset, so that it may be expected that the largest error signal will be on the order of eight bits (256 ministuffs) plus a sign bit, or nine bits. Choosing a convenient multiple of four bits (yielding a twelve bit error signal) will allow for errors up to +/−32 stuffs without overflow.

Having established a maximum value of β for β gain stage 123, the corresponding value of α for α gain stage 125 is determined. For this purpose, it is necessary to select a damping factor (half of the value 'a' in β). Values from 0.5 to 1.0 are typical, with a classical choice being 0.707 ($2^{1/2}/2$) for the usual tradeoffs among speed, stability, overshoot, etc. To realize a speedy response due to the presence of some latency between the time that an error is introduced at the HDSL transmitter and when it is detected at the receiver, a damping factor of 0.5 may be initially selected. For a damping factor of 0.5, the value 'a' in β becomes 1.0, so that β becomes $1*(w_oT)=2^{-9}$ at maximum gain, or $w_oT=2^{-9}$. The value of α for α gain stage 125 is then computed as $64*(w_oT)^2=64*2^{-18}=2^{-12}$ at maximum bandwidth.

To reach lower bandwidths without changing the damping ratio—that is, by changing only $w_o$, it can be seen that when the value of β is changed, the square of that changed value must be applied to α. Although bandwidth steps of factors of two produce acceptable results, steps of factors of four minimizes the number of gains required. A set of gains is derived by reducing bandwidth in steps of four. As tabulated in the GAIN CONTROL TABLE, set forth below, for each step, β is reduced by a factor of four (two bit shifts) and α is reduced by a factor of 16 (four bit shifts). As a result of analysis, it has been determined that in bandwidth steps of four, a minimum of seven steps are needed, beginning with the maximum gain derived above.

A significant improvement provided by the present invention over prior art configurations, such as that shown in FIG. 1, is the fact that the bandwidth of the configuration of FIG. 2 is adaptive, based on the size of the error signal. As noted above, in order to keep the damping factor constant, it is necessary to apply different gains to the two gain stage paths through the loop filter—scaling the error applies the same gain to both paths. It has been determined that by changing the bandwidth (and not damping) by stepping through a set of gain pairs for α and β, such as that tabulated in the GAIN CONTROL TABLE, based on the error magnitude, good results can be obtained. It should be observed that the set of magnitude error thresholds used to incrementally adjust the bandwidths in a stepwise manner, as described above, is a non-limiting example based upon performance analysis.

GAIN CONTROL TABLE

| Error Magnitude | α | β |
| --- | --- | --- |
| 0 to 48 Ministuffs | 2−36 | 2−21 |
| 49 to 56 Ministuffs | 2−32 | 2−19 |
| 57 to 64 Ministuffs | 2−28 | 2−17 |
| 65 to 96 Ministuffs | 2−24 | 2−15 |
| 97 to 128 Ministuffs | 2−20 | 2−13 |
| 129 to 256 Ministuffs | 2−16 | 2−11 |
| 257 or more Ministuffs | 2−12 | 2−9 |

In the improved digital phase locked loop-based clock control arrangement of FIG. 2, the delay stage 134 for the loop filter accumulator 126 and the delay stage 167 for the phase accumulator 150 are shown as being forty bits in length. These word lengths are a direct result of the range needed in the gain set—specifically, the minimum gains needed—in concert with the maximum values needed for the accumulators.

Figure 3:
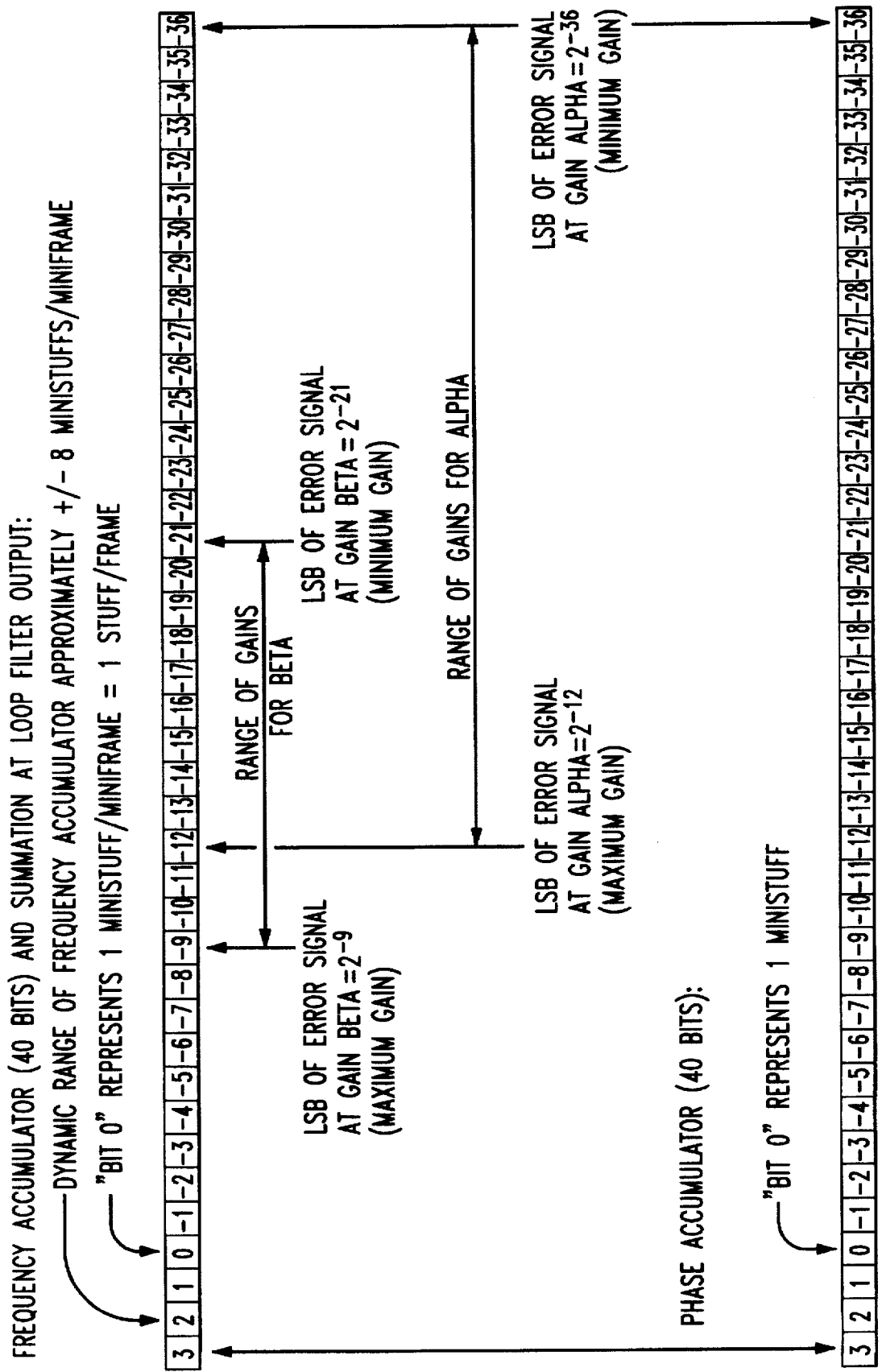
FIG. 3 is a diagrammatic illustration of accumulator bit assignments in the digital phase locked loop-based clock control arrangement of FIG. 2.

FIG. 3 is a diagrammatic illustration of accumulator bit assignments, showing how the bits are aligned in the accumulators and where the LSB of the error signal will map into the accumulators for the entire gain range. It is assumed that error information is not to be discarded, so that there must be a sufficient number of bits to accumulate the minimum error signal (one ministuff) at minimum gain. For a loop filter input error of '1' and a minimum α gain of $2^{-36}$ (from the GAIN CONTROL TABLE), it can be seen that the frequency accumulator 126 must keep bits down to $2^{-36}$ ministuffs per miniframe. Any larger resolution would not allow a minimum error at minimum gain to update the frequency word—it would be below the LSB. As a consequence, the low end is $2^{-36}$ ministuffs per miniframe.

At the high end, it is necessary to accommodate a maximum frequency offset with some margin for overshoot during transients and pull-in. As the maximum allowable offset is a little below half a ministuff per miniframe, one a bit for $2^{-1}$ ministuffs per miniframe, plus a sign bit are required. This would lead to a minimum of 36 bits plus a sign bit, or 37 bits. To provide for an additional bit or two as a safety factor (to avoid overflow), at least 38 bits should be employed. Working in sets of four bits yields a choice of forty bits for the length of the frequency accumulator.

Since the output of the loop filter 121 is coupled directly into the phase accumulator 150, it is logical to use the same forty bit length for the phase accumulator. The LSB must be the same used in order to use all the frequency word data. This same LSB will also ensure that at minimum error and minimum bandwidth, the direct term coming through the β gain stage 123 in the loop filter will be accumulated into phase—significantly larger than the LSB. At the high end, 40 bits provides a range of almost +/−8 ministuffs. Since the phase accumulator 150 will overflow to produce a DS1 clock adjustment signal at +/−1 ministuff for the chosen value of the threshold $V_T$, forty bits is a bit or so more than is necessary, but is a practical value for the phase accumulator as well. FIG. 3 also shows where the LSB of the error signal will fall for the entire range of gains considered. On the basis of the analysis described above, it can be expected that the error will not significantly exceed about +/−256 ministuffs, or nine bits above the LSB. For a safety margin, there should be a few bits left over beyond the MSB of the error signal when it is accumulated.

As will be appreciated from the foregoing description, the present invention provides a bandwidth-adaptive digital phase locked loop-based clock control arrangement, effecting a step-wise adjustment of the gains through the two gain stage paths through the loop filter, based on the size of the error signal. In the improved digital phase locked loop-based clock control arrangement of the present invention, the delay stage for the loop filter accumulator and the delay stage for the phase accumulator are multiple bits in length that encompass a range needed in the gain set—the minimum gains needed—in concert with the maximum values needed for the accumulators. No input gain stage is used in the phase accumulator, which eliminates the need for a multiply at the phase accumulator input, and provides a convenient scaling mechanism for the frequency accumulator in the loop filter.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A method for controlling the recovery of a digital data signal transported over a synchronous data channel of a communication system in which pulse-stuffing synchronization is employed to maintain clock synchronization of said digital data signal that is not bit-synchronous with a synchronous digital data channel over which said digital data signal is transported, said method comprising the steps of:

(a) serially clocking said digital data signal into a data input port of an elastic data buffer, in accordance with a first clock signal associated with symbol timing in said digital data signal;

(b) serially clocking said digital data signal out of said data buffer as a retimed digital data signal in accordance with a second, controllably adjustable read-out clock signal;

(c) generating an error signal in accordance with the difference between said first and second clock signals, as defined by the bit position difference in data-input and data-output pointers for said elastic buffer;

(d) coupling said error signal to a stepped bandwidth digital phase locked loop which controllably adjusts said second, controllably adjustable read-out clock signal relative to said first clock signal so as to minimize said error signal; and wherein said stepped bandwidth digital phase locked loop comprises a loop filter to which said error signal is applied, said loop filter having a stepwise adjustable transfer function that is incrementally adjusted in accordance with the magnitude of said error signal, and a phase accumulator, coupled to the output of said loop filter and being operative to stepwise adjust said second, controllably adjustable read-out clock signal, said loop filter has a first scaled path that includes a first, controllably stepped gain stage, and a second scaled path that includes a second, controllably stepped gain stage coupled to a frequency accumulator, the output of said frequency accumulator and said first, controllably stepped gain stage being summed and coupled to said phase accumulator, step (d) includes incrementally adjusting the gain of each of said first and second controllably stepped gain stages in accordance with the magnitude of said error signal, and each of said frequency and phase accumulators comprises a multi-bit accumulator having a number of bit stages that is sufficient to accommodate maximum frequency offset and to accumulate minimum error signal at minimum gain.

2. A method according to claim 1, wherein step (d) comprises establishing a respectively different gain for each of said first and second controllably stepped gain stages of said loop filter in response to the magnitude of said error signal falling with a respectively different range of error signal variation.

3. A method according to claim 2, wherein each respectively different gain is a binary gain.

4. A method according to claim 1, wherein each of said frequency and phase accumulators comprises a multi-bit accumulator having a number of bit stages that is at least as large as the exponential power of the maximum binary gain of each respectively different gain.

5. For use with a communication system in which pulse-stuffing synchronization is employed to maintain clock synchronization of a digital data signal that is not bit-synchronous with a synchronous digital data channel over which said digital data signal is transported, an arrangement for controlling the interfacing of said digital data signal transported over said synchronous data channel comprising:

an elastic data buffer having a data input port to which said digital data signal is serially coupled by means of a first clock signal associated with symbol timing in said digital data signal, and a data output port from which a retimed digital data signal is clocked out by means of a second clock signal derived from a controllably adjustable read-out clock signal generator; and a stepped bandwidth digital phase locked loop, to which an error signal corresponding to the difference between said first and second clock signals, as defined by the bit position difference in data-input and data-output pointers for said elastic buffer, is coupled, said stepped bandwidth digital phase locked loop being operative to controllably adjust the timing of said second clock signal relative to said first clock signal, so as to minimize said error signal; and wherein said stepped bandwidth digital phase locked loop comprises a loop filter to which said error signal is applied, said loop filter having a stepwise adjustable transfer function that is incrementally adjusted in accordance with the magnitude of said error signal, and a phase accumulator, coupled to the output of said loop filter and being operative to stepwise adjust the second clock signal derived from said controllably adjustable read-out clock signal generator, said loop filter has a first scaled path that includes a first, controllably stepped gain stage, and a second scaled path that includes a second, controllably stepped gain stage coupled to a frequency accumulator, the output of said frequency accumulator and said first, controllably stepped gain stage being summed and coupled to said phase accumulator, and wherein each of said first and second controllably stepped gain stages has the gain thereof incrementally adjusted in accordance with the magnitude of said error signal, and each of said frequency and phase accumulators comprises a multi-bit accumulator having a number of bit stages that is sufficient to accommodate maximum frequency offset and to accumulate minimum error signal at minimum gain.

6. An arrangement according to claim 5, wherein each of said first and second controllably stepped gain stages of said loop filter is operative to have a respectively different gain, in response to the magnitude of said error signal falling with a respectively different range of error signal variation.

7. An arrangement according to claim 6, wherein each respectively different gain is a binary gain.

8. An arrangement according to claim 5, wherein each of said frequency and phase accumulators comprises a multi-bit accumulator having a number of bit stages that is at least as large as the exponential power of the maximum binary gain of each respectively different gain.

9. A bandwidth-adaptive digital phase locked loop-based clock control arrangement for controlling the generation of a read-out clock signal used for retiming digital data signal interfaced with a synchronous data channel of a communication system, in which pulse-stuffing synchronization is employed to maintain clock synchronization of the digital data signal that is not bit-synchronous with a synchronous digital data channel over which the digital data signal is transported, said bandwidth-adaptive digital phase locked loop including a loop filter to which an error signal is applied and a phase accumulator, coupled to the output of the loop filter and being operative to stepwise adjust the read-out clock signal, said loop filter having a first phase adjustment path that includes a first, controllably stepped gain stage, and a second frequency adjustment path that includes a second, controllably stepped gain stage coupled to a frequency accumulator, said frequency accumulator and said first stepped gain stage being summed and coupled to said phase accumulator, and wherein each of the first and second gain stages has its gain incrementally adjusted in accordance with the magnitude of said error signal, and wherein each of said first and second controllably stepped gain stages of said loop filter is operative to have a respectively different gain, in response to the magnitude of said error signal falling with a respectively different range of error signal variation, and each of said frequency and phase accumulators comprises a multi-bit accumulator having a number of bit stages that is sufficient to accommodate maximum frequency offset and to accumulate minimum error signal at minimum gain.

10. A bandwidth-adaptive digital phase locked loop-based clock control arrangement according to claim 9, wherein each respectively different gain is a binary gain.

11. A bandwidth-adaptive digital phase locked loop-based clock control arrangement according to claim 9, wherein each of said frequency and phase accumulators comprises a multi-bit accumulator having a number of bit stages that is at least as large as the exponential power of the maximum binary gain of each respectively different gain.

* * * * *